US012666998B2

(12) United States Patent
Chang et al.

(10) Patent No.: US 12,666,998 B2
(45) Date of Patent: Jun. 23, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Hung-Pin Chang, New Taipei City (TW); Der-Chyang Yeh, Hsin-Chu (TW); Wei-Cheng Wu, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 393 days.

(21) Appl. No.: 18/316,237

(22) Filed: May 12, 2023

(65) Prior Publication Data

US 2024/0379482 A1      Nov. 14, 2024

(51) Int. Cl.
H01L 23/48 (2006.01)
H01L 23/52 (2006.01)
(Continued)

(52) U.S. Cl.
CPC ......... H10W 74/141 (2026.01); H10W 20/20 (2026.01); H10W 20/42 (2026.01);
(Continued)

(58) Field of Classification Search
CPC . H01L 23/3185; H01L 21/561; H01L 23/481; H01L 23/5226; H01L 24/08; H01L 25/105; H01L 2224/08145; H01L 25/0657; H01L 2924/181; H01L 2224/04105; H01L 21/56; H01L 2224/32225; H01L 2224/73204; H01L 23/3135; H01L 24/17; H01L 2224/0401; H01L 2224/16145; H01L 2224/32111; H01L 2225/06562; H01L 23/49827; H01L 25/0652; H01L 25/0655; H01L 2924/00014; H01L 21/4857; H01L 2224/24137; H01L 2224/92244; H01L 2224/97; H01L 23/3142; H01L 24/02;
(Continued)

(56) References Cited

U.S. PATENT DOCUMENTS 8,993,380 B2    3/2015   Hou et al.
9,281,254 B2    3/2016   Yu et al.
(Continued)

FOREIGN PATENT DOCUMENTS

TW            I717580         2/2021

OTHER PUBLICATIONS

"Office Action of Taiwan Counterpart Application", issued on Feb. 20, 2025, p. 1-p. 5.

*Primary Examiner* — Niki H Nguyen
(74) *Attorney, Agent, or Firm* — JCIPRNET

(57)                    ABSTRACT

A semiconductor device and a forming method thereof are provided. The semiconductor device includes an integrated circuit (IC) die and an encapsulant. The IC die includes a semiconductor substrate and an interconnect structure connected to the semiconductor substrate, the semiconductor substrate includes a first ledge, and the interconnect structure includes a second ledge. The encapsulant extends along the first ledge of the first semiconductor substrate and the second ledge of the first interconnect structure.

20 Claims, 13 Drawing Sheets

(51) Int. Cl.

| | |
|---|---|
| *H01L 29/40* | (2006.01) |
| *H10W 20/20* | (2026.01) |
| *H10W 20/42* | (2026.01) |
| *H10W 74/01* | (2026.01) |
| *H10W 74/10* | (2026.01) |
| *H10W 90/00* | (2026.01) |

(52) U.S. Cl.
CPC ......... *H10W 74/014* (2026.01); *H10W 90/00* (2026.01); *H10W 90/792* (2026.01)

(58) Field of Classification Search
CPC ................. H01L 24/05; H01L 21/4828; H01L 2224/0235; H01L 2224/04026; H01L 2224/02371; H01L 2224/05008; H01L 2224/05569; H01L 2224/0557; H01L 2224/05571; H01L 2225/06586; H01L 2224/92224; H01L 2224/92225; H01L 2224/95; H01L 23/147; H01L 24/06; H01L 2924/18162

See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,929,102 B1 * | 3/2018 | Lee ..................... | H01L 23/5389 |
| 2021/0202436 A1 * | 7/2021 | Yeh ........................ | H01L 24/13 |

* cited by examiner

SEMICONDUCTOR DEVICE AND MANUFACTURING METHOD THEREOF

BACKGROUND

Semiconductor devices and integrated circuits used in a variety of electronic applications are typically manufactured from a semiconductor wafer. The integrated circuit (IC) dies of the wafer may be processed and packaged with other electronic devices at the wafer level, and various technologies have been developed for wafer level packaging. In addition, for multi-die packages, the arrangement of the IC dies and the packaging techniques affect reliability of the packaged products.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
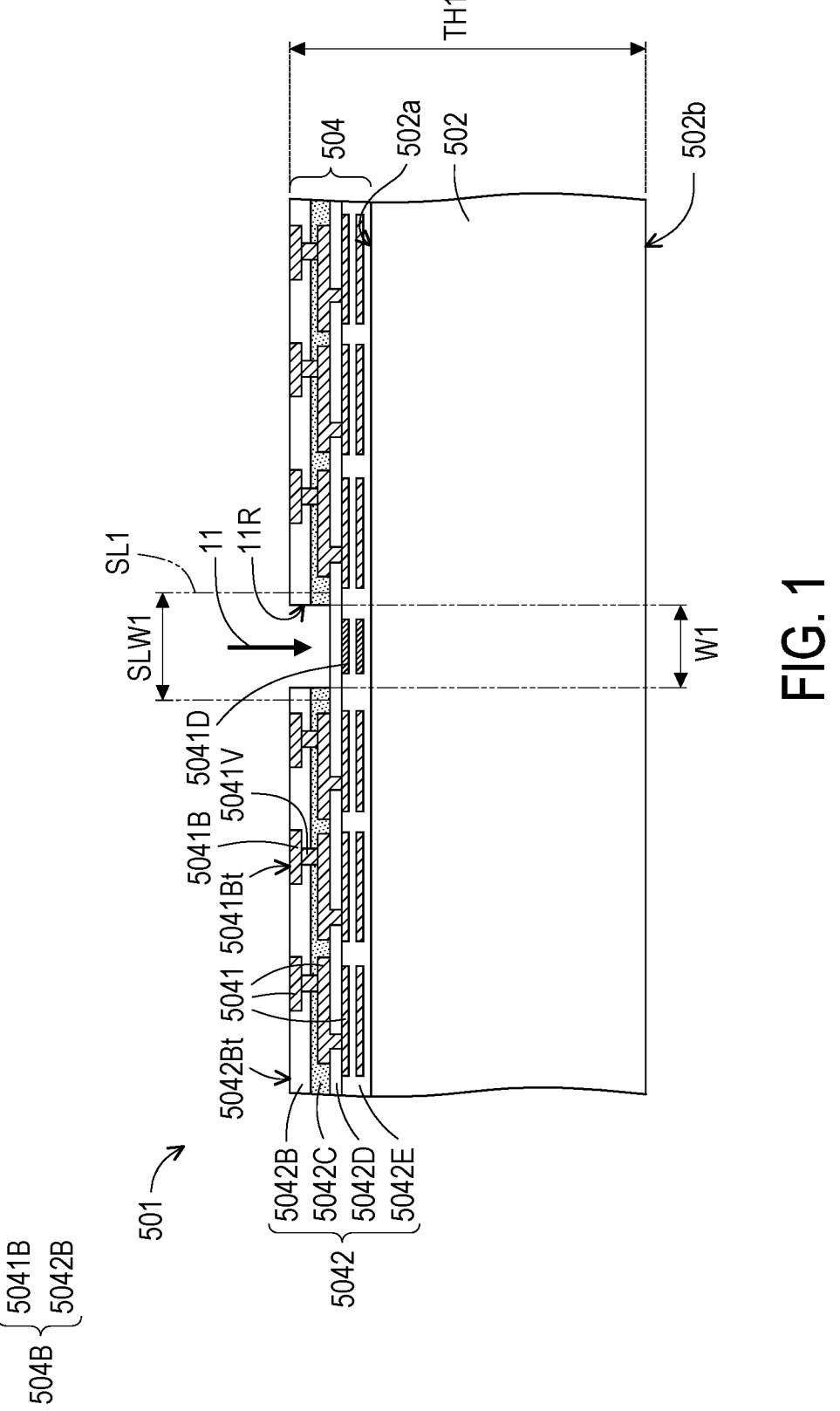
FIGS. 1 through 8 illustrate schematic views of intermediate steps during a process for forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
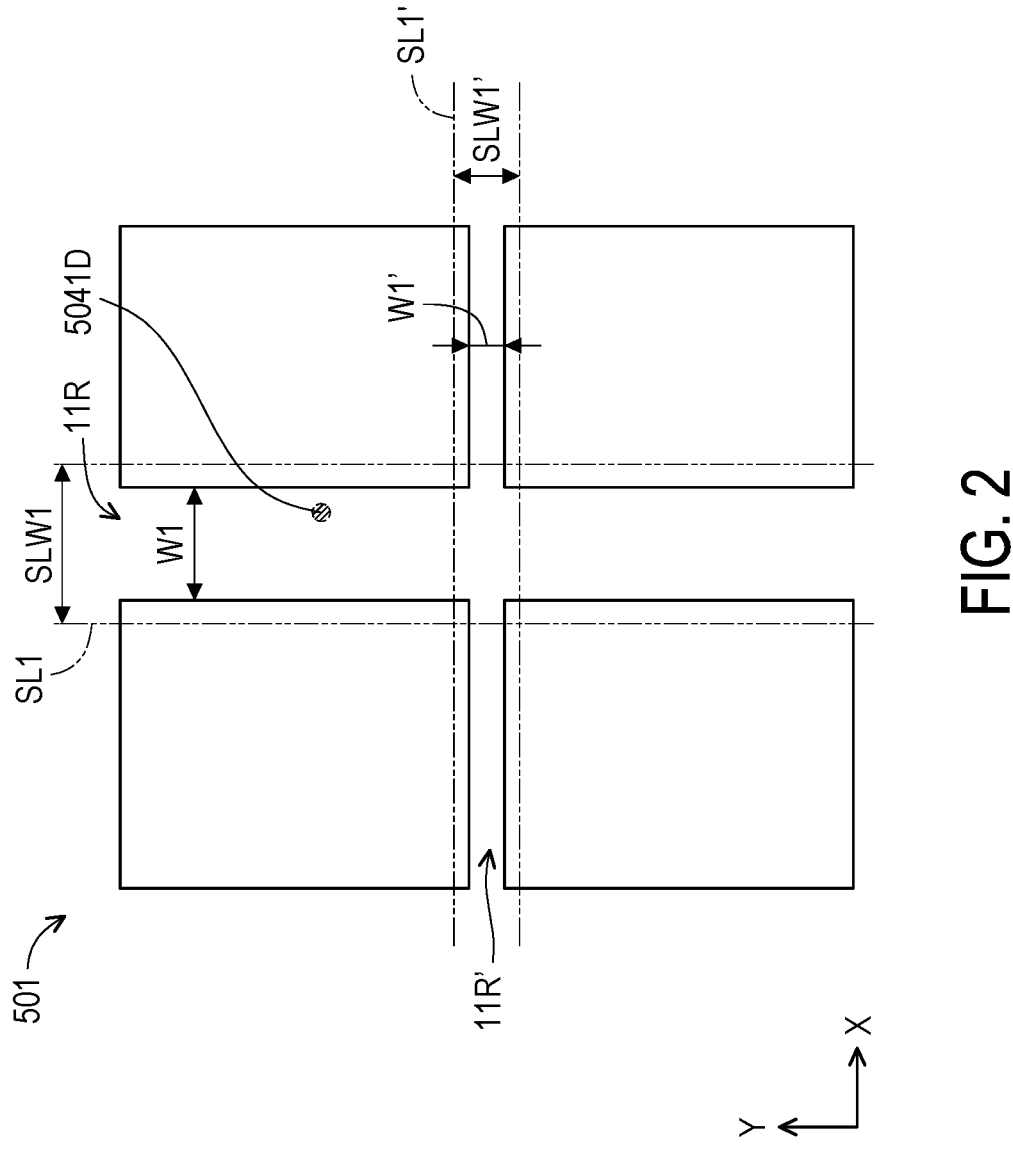
Figure 4:
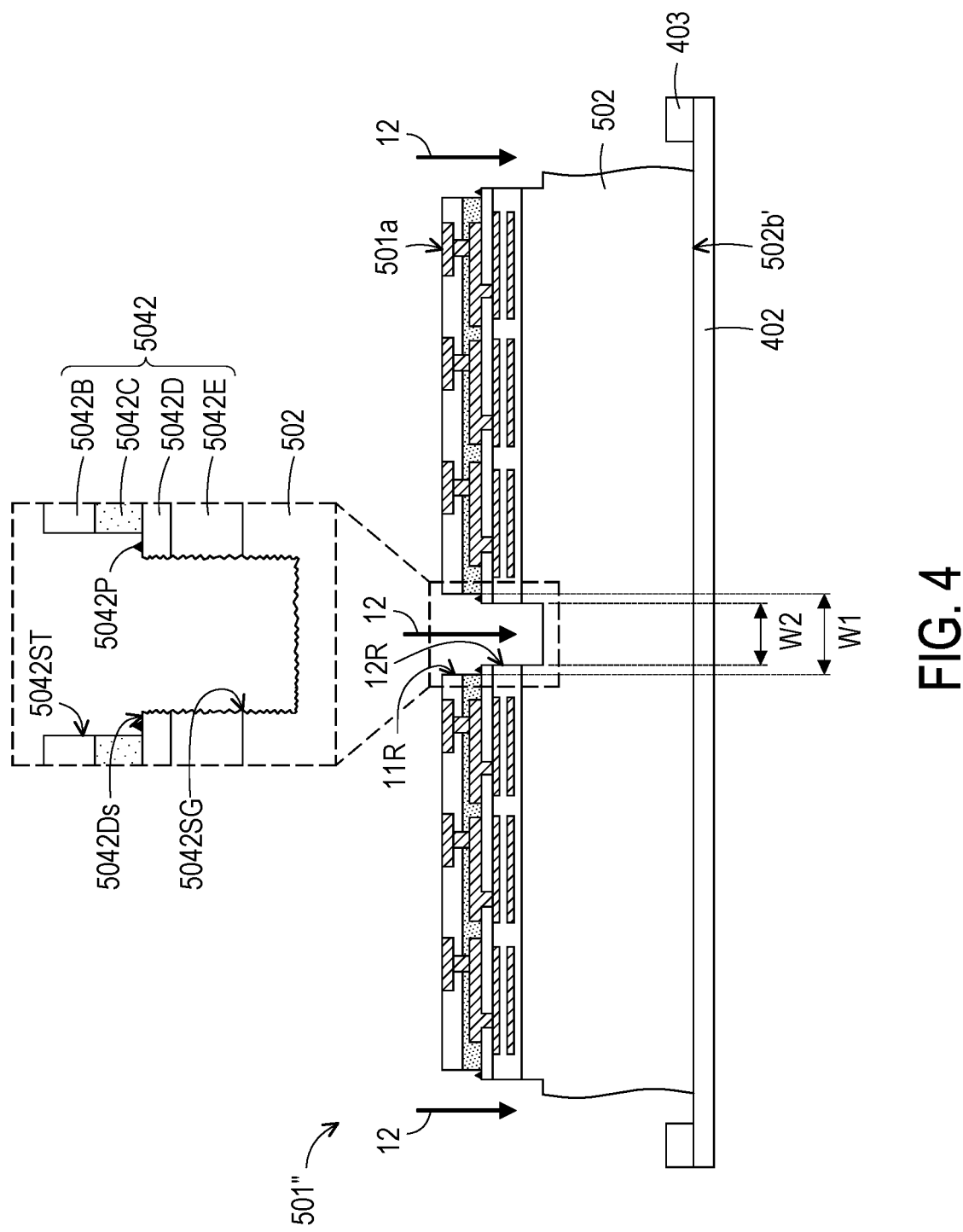
Figure 5:
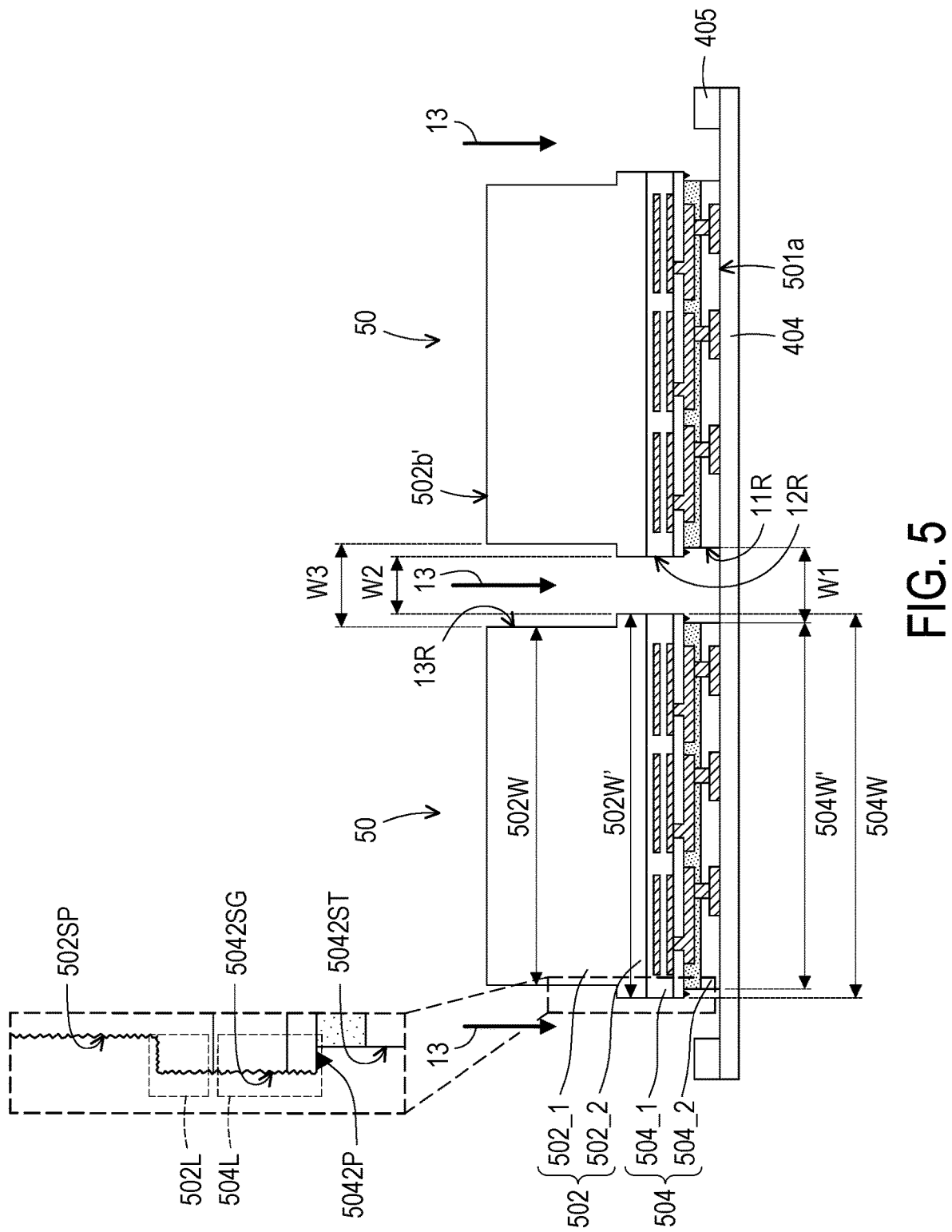
Figure 6:
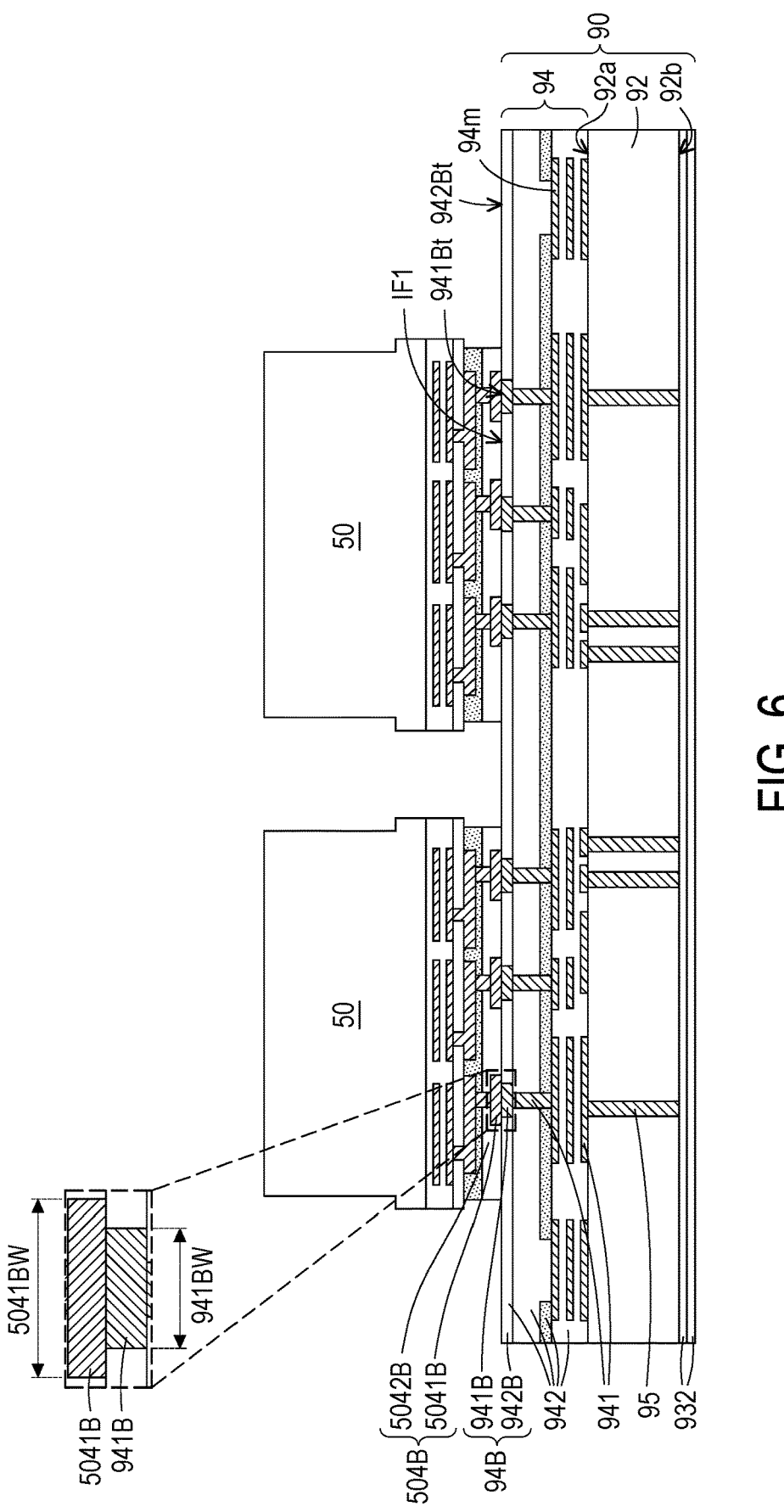
Figure 7:
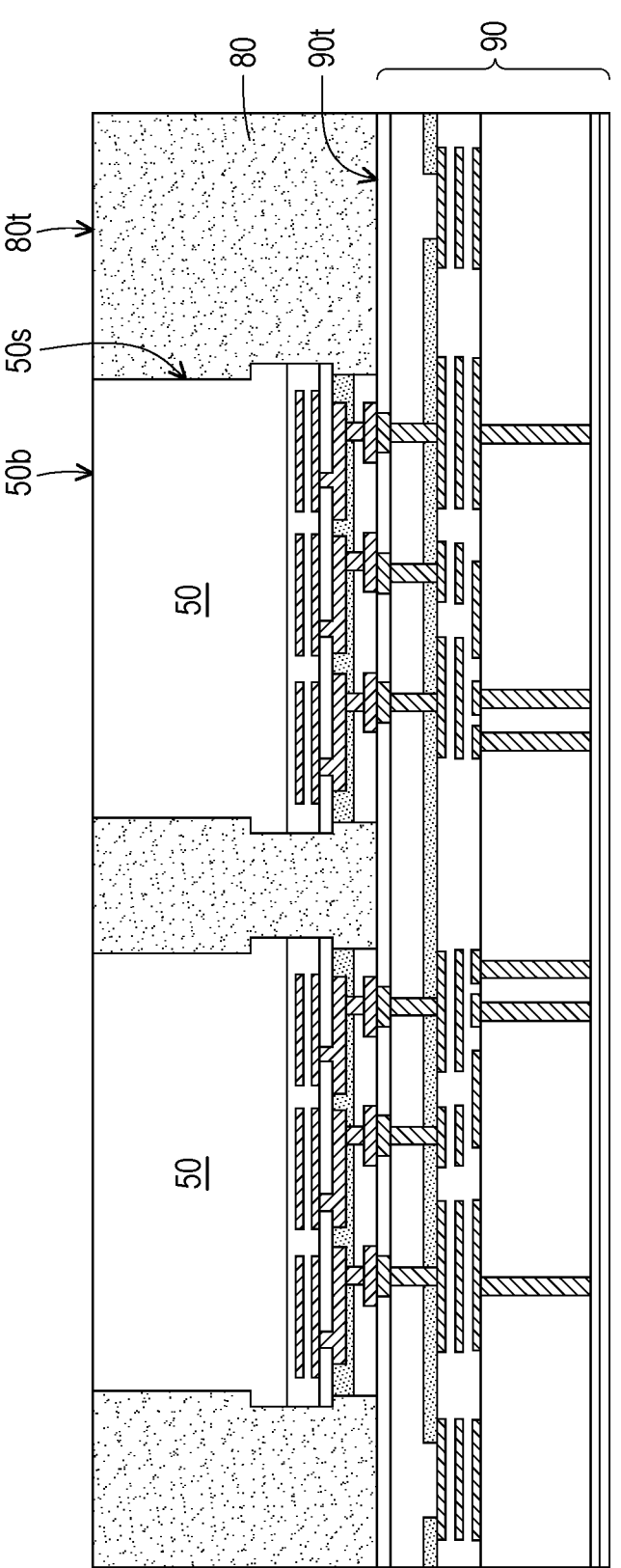
Figure 8:
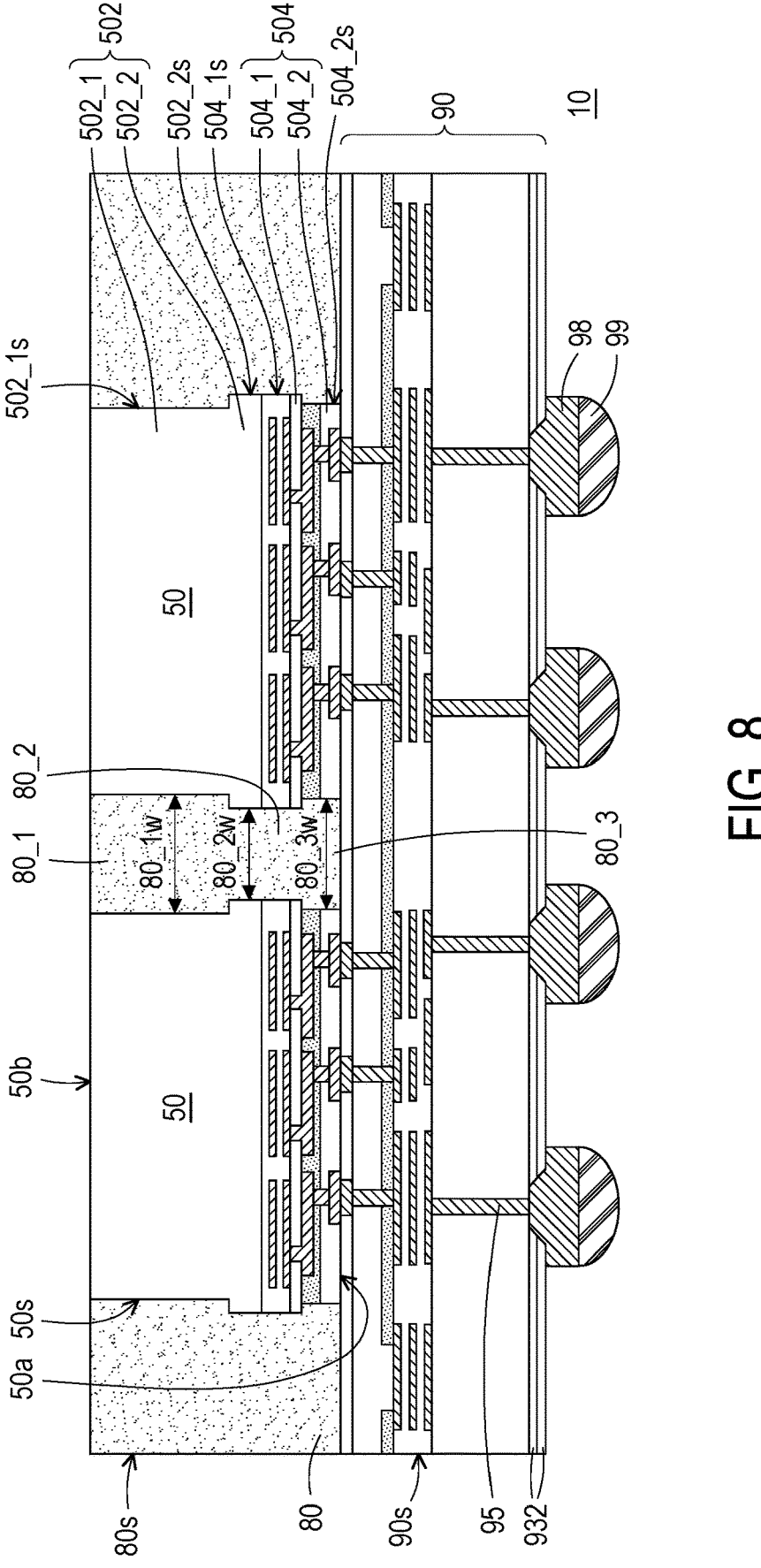

FIGS. 1 through 8 illustrate schematic views of intermediate steps during a process for forming a semiconductor device, in accordance with some embodiments. FIGS. 1-5 are schematic views of various stages in the manufacturing of top integrated circuit (IC) dies 50, and FIGS. 6-8 are schematic views of various stages in the manufacturing of a semiconductor device 10, in accordance with some embodiments. Note that FIG. 2 is a schematic top-down view of the structure illustrated in FIG. 1 according to some embodiments.

Referring to FIG. 1, a semiconductor wafer 501 is provided. The semiconductor wafer 501 may include a plurality of die regions and the die regions will be separated by the subsequently-performed singulation process through a scribing lane SL to form individual top IC dies. The semiconductor wafer 501 may be provided with a thickness TH1 over 700 μm, such as about 775 μm. The semiconductor wafer 501 includes a semiconductor substrate 502, such as silicon, doped or undoped, or an active layer of a semiconductor-on-insulator (SOI) substrate. The semiconductor substrate 502 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 502 may have an active surface 502a (e.g., the surface facing upwards in FIG. 1) and a rear surface 502b (e.g., the surface facing downwards in FIG. 1). Devices (not separately illustrated) may be formed at the active surface 502a of the semiconductor substrate 502. The devices may be active devices (e.g., transistors, diodes, etc.) or passive devices (e.g., capacitors, resistors, etc.).

The semiconductor wafer 501 may include an interconnect structure 504 formed over the active surface 502a of the semiconductor substrate 502 and interconnecting the devices to form integrated circuits. For example, the interconnect structure 504 is formed of layers of conductive patterns 5041 embedded in dielectric layers 5042. The conductive patterns 5041 including conductive lines, conductive pads, and conductive vias may be formed of a suitable conductive material, such as copper, tungsten, aluminum, silver, gold, a combination thereof, or the like. The bottommost layer of the conductive patterns 5041 may be in physical and electrical contact with the devices at the active surface 502a. The topmost layer of the conductive patterns 5041 may include bonding conductive features 5041B for further electrical connection. The bonding conductive features 5041B may be bond pads, bond vias, a combination thereof, or the like. In some embodiments, the conductive patterns 5041 include one or more layers of dummy features 5041D that are electrically floating in the interconnect structure 504. For example, the conductive patterns 5041 electrically coupled to the bonding conductive features 5041B for forming functional circuits are substantially formed out of the exclusion zone (e.g., the scribing lane SL), and the dummy features 5041D are formed within the exclusion zone. The dummy features 5041D may serve as alignment marks and may be considered sacrificial in the sense that they will be ultimately removed.

The dielectric layers 5042 of the interconnect structure 504 may include one or more dielectric materials including an oxide (e.g., silicon oxide, phosphosilicate glass (PSG), borosilicate glass (BSG), boron-doped phosphosilicate glass (BPSG), a tetraethyl orthosilicate (TEOS) based oxide, etc.), a nitride (e.g., silicon nitride or the like), a combination thereof, or the like. In some embodiments, the dielectric layers 5042 includes polyimide, acrylic resin, phenol resin, benzocyclobutene (BCB), polybenzooxazole (PBO), or other polymer-based dielectric material. In some embodiments, the dielectric layers 5042 includes a first dielectric layer 5042B, a second dielectric layer 5042C underlying the first dielectric layer 5042B, a third dielectric layer 5042D underlying the second dielectric layer 5042C, and a fourth dielectric layer 5042E underlying the third dielectric layer 5042D. The third dielectric layer 5042D may be an etch stop layer having a material different from that of the overlying second dielectric layer 5042C. The first dielectric layer 5042B may be a bonding dielectric layer laterally covering the bonding conductive features 5041B. For example, top surfaces 5041Bt of the bonding conductive features 5041B are substantially leveled (e.g., coplanar) with a top surface 5042Bt of the bonding dielectric layer 5042B. The bonding conductive features 5041B and the bonding dielectric layer 5042B may be collectively viewed as a bonding layer 504B. In some embodiments, the respective topmost conductive via 5041V includes an upper portion laterally covered by the bonding dielectric layer 5042B and a lower portion laterally covered by the second dielectric layer 5042C.

With continued reference to FIG. 1, a first recessing process 11 is performed on the semiconductor wafer 501 to form a first recess 11R. For example, the first recessing process 11 involves etching a portion of the bonding dielectric layer 5042B and a portion of the second dielectric layer 5042C underlying the bonding dielectric layer 5042B, resulting in the first recess 11R accessibly exposing a top surface of the third dielectric layer 5042D. The etching may be an anisotropic etching or an isotropic etching. In some embodiments, the first recess 11R is formed within the scribing lane SL1. For example, the first recess 11R is limited in the boundary of the scribing lane SL1, and does not extend into the die regions.

Referring to FIG. 2 and with reference to FIG. 1, in the top-down view, scribing lanes (SLW1 and SLW1') may be allocated parallel to the X-axis direction and/or parallel to the Y-axis direction. In some embodiments, multiple scribing lanes SLW1 and SLW1' are evenly spaced and parallel to each other. In some embodiments, the first recess 11R may be located within the scribing lane SL1 in the Y-axis direction, and the first recess 11R' may be located within the scribing lane SL1' in the X-axis direction. The respective first recess (11R/11R') may refer to a trench whose length and width are different. The scribing lanes (SLW1 and/or SLW1') and the first recesses (11R and/or 11R') may include various dimensions, such as width. In some embodiments, a width W1 of the first recess 11R is less than a width SLW1 of the scribing lane SL1, and a width W1' of the first recess 11R' is less than a width SLW1' of the scribing lane SL1'. For example, the width (SLW1 and/or SLW1') is in a range between about 60 μm and 660 μm. The width SLW1 of the scribing lane SL1 and the width SLW1' of the scribing lane SL1' may be substantially the same (or may be different, in some embodiments). The width (W1 and/or W1') may be in a range between about 30 μm and 150 μm. The width W1 of the first recess 11R in the Y-axis direction and the width W1' of the first recess 11R' in the X-axis direction may be substantially the same (or may be different, in some embodiments).

One or more dummy features 5041D may be disposed within the scribing lanes (SL1 and/or SL1'). In some embodiments, the dummy features 5041D may be allocated underneath the first recesses 11R and/or 11R'. In FIG. 2, the dashed line of the dummy feature 5041D indicates that the dummy feature 5041D covered by the dielectric layer is not accessibly revealed at this stage. It should be noted that FIG. 2 schematically illustrates circular-shaped dummy feature 5041D, although any desired shape of the dummy features may alternatively be formed.

Figure 3:
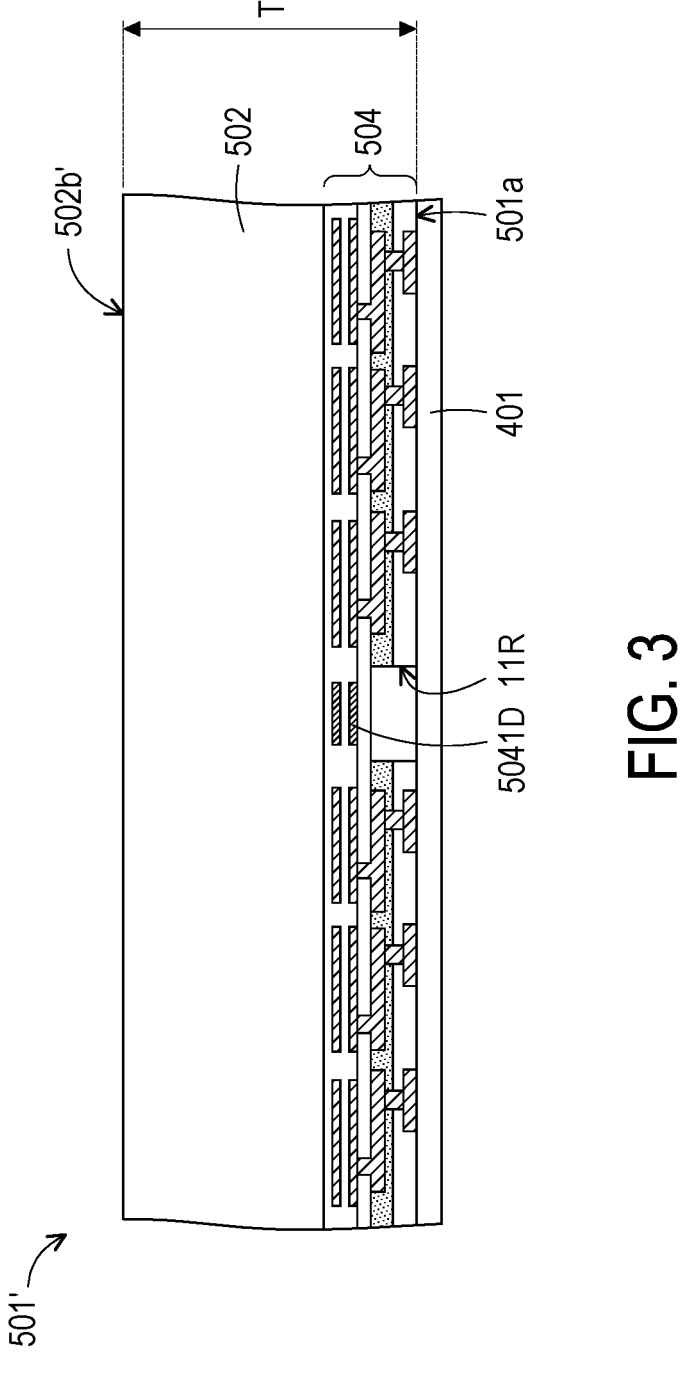

Referring to FIG. 3 and with reference to FIG. 1, once the first recessing process 11 has been completed, the resulting structure may be flipped over, and the interconnect structure 504 may be attached to a tape 401 for further processing. In some embodiments, a thinning process (e.g., chemical-mechanical polishing (CMP), grinding, etching-back, combinations thereof, or the like) is performed on the rear surface 502b of the semiconductor substrate 502. The thinning process may be referred to as a backside grinding process. The tape 401 may be referred to as a grinding tape which is used to be a protective layer covering the front surface 501a of the semiconductor wafer 501 during the thinning. After the thinning, the semiconductor wafer 501' may have a thickness TH2 measured from the front surface 501a to the thinned rear surface 502b', where the thickness TH2 may be in a range of about 50 μm and about 600 μm. The thinner wafer allows heat to dissipate faster providing cooler running dies. In alternative embodiments, the thinning process is skipped.

Referring to FIG. 4 and with reference to FIG. 3, once the thinning process has been completed, the tape 401 may be removed from the front surface 501a of the semiconductor wafer 501' by a suitable process, such as mechanical peel off, etching, or the like. Next, the resulting structure may be flipped over, and the thinned rear surface 502b' may be placed on a tape 402 (e.g., a dicing tape) supported by a frame 403. Subsequently, a second recessing process 12 is performed on the semiconductor wafer 501' to form the semiconductor wafer 501" having a second recess 12R which extends from the first recess 11R. In some embodiments, the second recessing process 12 involves removing a portion of the third dielectric layer 5042D and a portion of the fourth dielectric layer 5042E underlying the portion of the third dielectric layer 5042D by, e.g., laser grooving or any suitable technique. The dummy features 5041D may act as alignment marks during the formation of the second recess 12R. During the removal of the dielectric layers 5042D and 5042E, the dummy features 5041D may also be removed. In some embodiments, during the second recessing process 12, a portion of the semiconductor substrate 502 underlying the portion of the fourth dielectric layer 5042E may be removed. The second recess 12R may not extend fully through the semiconductor substrate 502, and may expose a surface of the semiconductor substrate 502.

In some embodiments, the second recessing process 12 may be exothermic and dielectric protrusions 5042P are formed as a result of the exothermic reaction. For example, the second recessing process 12 transports photon energy (e.g., laser) first into the target material (e.g., the third dielectric layers 5042D) in the form of thermal energy or photochemical energy, and the target material is then removed. The laser treatment employed in the second recessing process 12 tends to result in heat transfer to the target material resulting in an affected region, where the affected region is on the target material that is not removed, but is affected by heat. The dielectric protrusions 5042P may be generated from the target material in the affected region. For example, the dielectric protrusions 5042P may at least include chemical elements of the third dielectric layers 5042D. In some embodiments, the dielectric protrusions 5042P are formed on the upper surface 5042Ds of the third dielectric layers 5042D which is exposed by the first recess 11R. In some embodiments, the dielectric protrusions 5042P are formed at the intersection of the inner sidewall of the second dielectric layer 5042C and the upper surface 5042Ds of the third dielectric layer 5042D.

With continued reference to FIG. 4, a width W2 of the second recess 12R may be less than the width W1 of the first recess 11R directly above the second recess 12R. For example, the difference between the widths W1 and W2 is about 10 μm, although other values may also be adopted, depending on the process parameters. The first recess 11R formed by the first recessing process 11 (see FIG. 1) is defined by an inner sidewall 5042ST and the second recess 12R formed by the second recessing process 12 is defined by an inner sidewall 5042SG. The inner sidewall 5042ST may be smoother than the inner sidewall 5042SG. For example, a surface roughness of the inner sidewall 5042ST is less than a surface roughness of the inner sidewall 5042SG.

Referring to FIG. 5 and with reference to FIG. 4, once the second recessing process 12 has been completed, the resulting structure may be released from the tape 402 and flipped over to be placed on another tape 404 supported by another frame 405 for further processing. For example, the front surface 501a of the semiconductor wafer 501" is attached to the tape 404 and the thinned rear surface 502b' is then accessibly revealed. Next, a third recessing process 13 may be performed on the semiconductor wafer 501" to form a third recess 13R connected to the second recess 12R. In some embodiments, the third recessing process 13 is applied to cut through the remaining semiconductor substrate 502 along the scribing lanes (see FIGS. 1-2). The semiconductor wafer 501" may thus be separated into an array of discrete top IC dies 50. The first recessing process, the second recessing process, and the third recessing process may be collectively viewed as a singulation process. For example, the third recess 13R is formed by dicing, which utilizes any suitable dicing tool (e.g., a blade, a saw, an abrasive disc, or combinations thereof). For example, the dicing tool (not shown) starts cutting into the thinned rear surface 502b' of the semiconductor wafer 501". As the dicing tool travels downward, the dicing tool does not contact the interconnect structure 504 due to the second recess 12R extending into the semiconductor substrate 502. A cleaning (or rinsing) process is optionally performed after the third recessing process 13.

In some embodiments, a width W3 of the third recess 13R formed by blade (or saw) dicing is larger than the width W2 of the second recess 12R formed by laser grooving. For example, the difference between the widths W3 and W2 is about 10 μm or less, although other values may also be adopted, depending on the process parameters. In some embodiments, the width W3 of the third recess 13R is larger than the width W1 of the first recess 11R formed by etching. The third recess 13R formed by dicing may be defined by an inner sidewall 502SP and the inner sidewall 502SP may be rougher than the inner sidewall 5042ST that defines the first recess 11R. For example, a surface roughness of the inner sidewall 5042ST is less than a surface roughness of the inner sidewall 502SP.

With continued reference to FIG. 5, the top IC dies 50 may each include the semiconductor substrate 502 and the interconnect structure 504 connected to the semiconductor substrate 502. The semiconductor substrate 502 may include a first portion 502_1 and a second portion 502_2 interposed between the first portion 502_1 and the interconnect structure 504. A region of the second portion 502_2 protruded from the first portion 502_1 may be viewed as a ledge 502L of the semiconductors substrate 502. The first portion 502_1 may have a lateral dimension (e.g., width) 502W less a lateral dimension (e.g., width) 502W' of the second portion 502_2, and thus the first portion 502_1 may be a narrow portion and the second portion 502_2 may be a wide portion. The interconnect structure 504 may include a first portion 504_1 connected to the second portion 502_2 of the semiconductor substrate 502 and a second portion 504_2 underlying the first portion 504_1. A region of the first portion 504_1 protruded from the second portion 504_2 may be viewed as a ledge 504L of the interconnect structure 504 underlying the ledge 502L of the semiconductors substrate 502. The first portion 504_1 may have a lateral dimension (e.g., width) 504W greater a lateral dimension (e.g., width) 504W' of the second portion 504_2, and thus the first portion 504_1 may be a wide portion and the second portion 504_2 may be a narrow portion. In some embodiments, the width 504W of the first portion 504_1 of the interconnect structure 504 is substantially equal to the width 502W' of the second portion 502_1 of the semiconductor substrate 502.

The dielectric protrusions 5042P may be formed on the ledge 504L of the interconnect structure 504, such as at the intersection of the first portion 504_1 and the second portion 504_2 of the interconnect structure 504. The sidewall 5042ST of the second portion 504_2 of the interconnect structure 504 may be smoother than the sidewall 5042SG of the first portion 504_1 of the interconnect structure 504 and the second portion 502_2 of the semiconductor substrate 502. The sidewall 5042ST of the second portion 504_2 of the interconnect structure 504 may be smoother than the sidewall 502SP of the first portion 502_1 of the semiconductor substrate 502.

The respective top IC dies 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The top IC dies 50 may be the same or different.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Referring to FIG. 6 and with reference to FIG. 5, once the formation of the top IC dies 50 is complete, one or more top IC die(s) 50 may be picked up from the tape 404 and placed on a bottom IC die 90. In the illustrated embodiment, two top IC dies 50 bonded to the bottom IC die 90 is shown as an example, other layouts are contemplated. For example, the top IC dies 50 are arranged in an array-like structure of columns and rows on the bottom IC die 90. The bottom IC die 90 may be a logic die (e.g., CPU, GPU, SoC, AP, microcontroller, etc.), a memory die (e.g., DRAM die, SRAM die, etc.), a power management die (e.g., PMIC die), a RF die, a sensor die, a MEMS die, a signal processing die (e.g., DSP die), a front-end die (e.g., AFE die), the like, or combinations thereof. The bottom IC die 90 may include a semiconductor substrate 92, which may have a front surface 92a and a rear surface 92b opposite to the front surface 92a. The material of the semiconductor substrate 92 may be similar to the semiconductor substrate 502 of the top IC dies 50 described in the previous paragraphs. Devices (not separately illustrated) may be disposed at the front surface 92a of the semiconductor substrate 92. The devices may be active devices (e.g., transistors, diodes, etc.), capacitors, resistors, or the like. In alternative embodiments, the bottom IC die 90 is an interposer die that may (or may not) include active devices and/or passive devices.

The bottom IC die 90 may include an interconnect structure 94 disposed on the front surface 92a of the semiconductor substrate 92. The interconnect structure 94 may include conductive patterns 941 embedded in dielectric layers 942. The conductive patterns 941 and the dielectric layers 942 may be respectively similar to the conductive patterns 5041 and the dielectric layers 5042 described in the previous paragraphs. In some embodiments, the dielectric layers 942 includes a topmost dielectric layer which serves as a bonding dielectric layer 942B, and the conductive patterns 941 includes a topmost conductive pattern which serves as bonding conductive features 941B. The bonding conductive features 941B and the bonding dielectric layer 942B may be collectively viewed as a bonding layer 94B. For example, top surfaces 941Bt of the bonding conductive features 941B are substantially leveled (e.g., coplanar) with a top surface 942Bt of the bonding dielectric layer 942B. In some embodiments, a portion 94m of the conductive patterns 941 is disposed at the periphery of the interconnect structure 94 and may serve as alignment marks during the bonding process, where the alignment marks may be electrically floating in the interconnect structure 94.

The bottom IC die 90 may include through substrate vias (TSVs) 95 extending through the semiconductor substrate 92 and electrically coupled to the conductive patterns 941 of the interconnect structure 94. In some embodiments, the bottom IC die 90 includes one or more backside dielectric layers 932 disposed on the rear surface 92b of the semiconductor substrate 92 for protection. In some embodiments, conductive patterns (not shown) may be formed in the backside dielectric layers 932 and electrically coupled to the TSVs 95, where the conductive patterns and the backside dielectric layers 932 covering the conductive patterns may be collectively viewed as a backside interconnect structure.

With continued reference to FIG. 6, the top IC dies 50 may be bonded to the bottom IC die 100 by bonding the bonding dielectric layer 5042B and the bonding conductive features 5041B of the respective top IC die 50 to the bonding dielectric layer 942B and the bonding conductive features 941B of the bottom IC die 90, respectively. The bonding dielectric layers 5042B may be directly bonded to the bonding layer 942B through dielectric-to-dielectric bonding, and the bonding conductive features 5041B may be directly bonded to the bonding conductive features 941B with a one-to-one correspondence through metal-to-metal bonding. The bonding may be performed by initially pressing the top IC dies 50 against the bottom IC die 90, followed by annealing the top IC dies 50 and the bottom IC die 90 to improve the bonding strength at the interface IF1. The interface IF1 of the respective top IC die 50 and the bottom IC die 90 may be substantially flat and may include metal-to-metal bonds and dielectric-to-dielectric bonds. In some embodiments, the interface IF1 further includes metal-to-dielectric bonds. The interface IF1 may be free of solder materials.

Still referring to FIG. 6, the respective bonding conductive feature 941B may have a width 941BW less than a width 5041BW of the overlying bonding conductive feature 5041B. In other embodiments, the width 941BW and the width 5041BW are substantially equal. Alternatively, the width 941BW is greater than the width 5041BW. In some embodiments, the center of the respective bonding conductive feature 941B is substantially aligned with that of the overlying bonding conductive feature 5041B. Alternatively, the center of the respective bonding conductive feature 941B is laterally offset from that of the overlying bonding conductive feature 5041B in the cross-sectional view.

Referring to FIG. 7 and with reference to FIG. 6, an encapsulant 80 may be formed on the bottom IC die 90 to laterally cover each of the top IC dies 50. The encapsulant 80 may include a base material and filler particles in the base material, the base material may be a polymer, a resin, an epoxy, or the like, and the fillers may be the particles of a dielectric material(s) such as $SiO_2$, $Al_2O_3$, silica, or the like. In some embodiments, the encapsulant 80 includes a molding compound or a molding underfill, such as an epoxy, a resin, or the like, and is formed by compression molding, transfer molding, etc. In some embodiments, the encapsulant 80 includes a dielectric material, such as silicon oxide, PSG, BSG, BPSG, a TEOS based oxide, etc., and is formed by a suitable deposition process such as CVD, ALD, or the like. In some embodiments, the encapsulant 80 is free of fillers. In some embodiments, a layer of the encapsulating material is initially formed on the upper surface 90t of the bottom IC die 90 to cover the uneven sidewall 50s and the rear surface 50b of the respective top IC die 50, and then a planarization process (e.g., a CMP process, a grinding process, an etchback process, combinations thereof, etc.) is performed to remove excess portions of the encapsulating material overlying the rear surfaces 50b of the top IC dies 50 to form the encapsulant 80 accessibly exposing the rear surfaces 50b of the top IC dies 50. In some embodiments, an upper surface 80t of the encapsulant 80 and the rear surfaces 50b of the top IC dies 50 are substantially leveled (e.g., coplanar), within process variations.

Referring to FIG. 8 and with reference to FIG. 7, under-bump metallizations (UBMs) 98 may be formed through the backside dielectric layer 932 to be electrically coupled to the TSVs 95, and conductive terminals 99 may be formed on the UBMs 98. As an example to form the UBMs 98, the backside dielectric layer 932 may be patterned to form openings exposing the underlying TSVs 95 (or conductive patterns in the backside dielectric layers, if exist), and then one or more conductive materials may be formed in the openings of the backside dielectric layer 932 to form the UBMs 98. In some embodiments, the conductive terminals 99 include a conductive material such as solder, copper, aluminum, gold, nickel, silver, palladium, tin, the like, or a combination thereof. The conductive terminals 99 may be formed by forming a layer of solder on the UBMs 98, followed by reflowing to shape the solder into the desired bump shapes. The conductive terminals 99 may be ball grid array (BGA) connectors, solder balls, metal pillars, controlled collapse chip connection (C4) bumps, micro bumps, electroless nickel-electroless palladium-immersion gold (ENEPIG) technique formed bumps, or the like. The top IC dies 50 may be electrically coupled to the conductive terminals 99 through the bottom IC die 90. In some embodiments, the processes discussed in FIGS. 6-8 are performed by using wafer-level processing, and a singulation process may be performed by cutting through the encapsulant 80 and the underlying bottom IC die 90 to form individual semiconductor devices 10. For example, the outer sidewall 80s of the encapsulant 80 is substantially aligned (or coterminous) with the outer sidewall 90s of the bottom IC die 90.

As shown in FIG. 8, the semiconductor device 10 including the top IC dies 50 bonded to the bottom IC die 90 and laterally covered by the encapsulant 80 is provided. The respective top IC die 50 may include the uneven (or discontinuous) sidewall 50s connected to the rear surface 50b and the active (or bonding) surface 50a. For example, the sidewall 502_2s of the second portion 502_2 of the semiconductor substrate 502 is laterally protruded from the sidewall 502_1s of the first portion 502_1 of the semiconductor substrate 502. The sidewall 504_1s of the first portion 504_1 of the interconnect structure 504 may be laterally protruded from the sidewall 504_2s of the second portion 504_2 of the interconnect structure 504. A portion of the encapsulant 80 between two adjacent top IC dies 50 and extending along the uneven sidewalls 50s of the top IC dies 50 may have different lateral dimensions (e.g., widths). For example, the encapsulant 80 includes a first portion 80_1 having a width 80_1w, a second portion 80_2 underlying the first portion 80_1 and having a width 80_2w, and a third portion 80_3 interposed between the second portion 80_2 and the bottom IC die 90 and having a width 80_3w. The width 80_1w is measured between nearest adjacent sidewalls 502_1s of two adjacent top IC dies 50, the width 80_2w is measured between nearest adjacent sidewalls 502_2s (or 504_1s) of two adjacent top IC dies 50, and the width 80_3w is measured between nearest adjacent sidewalls 504_2s of two adjacent top IC dies 50. In some embodiments, the width 80_1w of the first portion 80_1 is larger than the width 80_2w of the second portion 80_2, and the width 80_3w of the third portion 80_3 is larger than the width 80_2w of the second portion 80_2. The difference in widths (80_1w and 80_2w) and the widths (80_2w and 80_3w) results in ledges along the sidewall of the respective top IC die 50. It is believed that the ledges formed along the sidewall of the respective top IC die 50 reduces the effect of coefficient of thermal expansion (CTE) mismatch stress between the encapsulant 80 and the top IC dies 50, thereby eliminating the interfacial delamination and improving the reliability of the semiconductor device 10.

The encapsulant 80 having different widths may act as a jig which is used to compress the respective top IC die 50 from bonding delamination. It was observed that due to the CTE mismatch between the top IC dies and the encapsulant extending along a vertical sidewall of the respective top IC die, the delamination occurs at the interface of the top IC die and the bottom IC die during/after during packaging processes (e.g., thermal cycling processes). Interfacial delamination causes reliability and yield issues. In the present embodiment, by singulating the semiconductor wafer through multiple recessing processes, the top IC dies 50 having the uneven sidewalls 50s are obtained. By allowing the encapsulant 80 with different widths to extend along the uneven sidewalls 50s of the respective top IC die 50 so as to act as a jig, the likelihood of interfacial delamination in the packaging process is reduced and a more effective bonding between the top IC dies and the bottom IC die may be achieved. As a result, defects at the bonding interface are prevented, thereby leading to an improved reliability of the semiconductor device.

Figure 9:
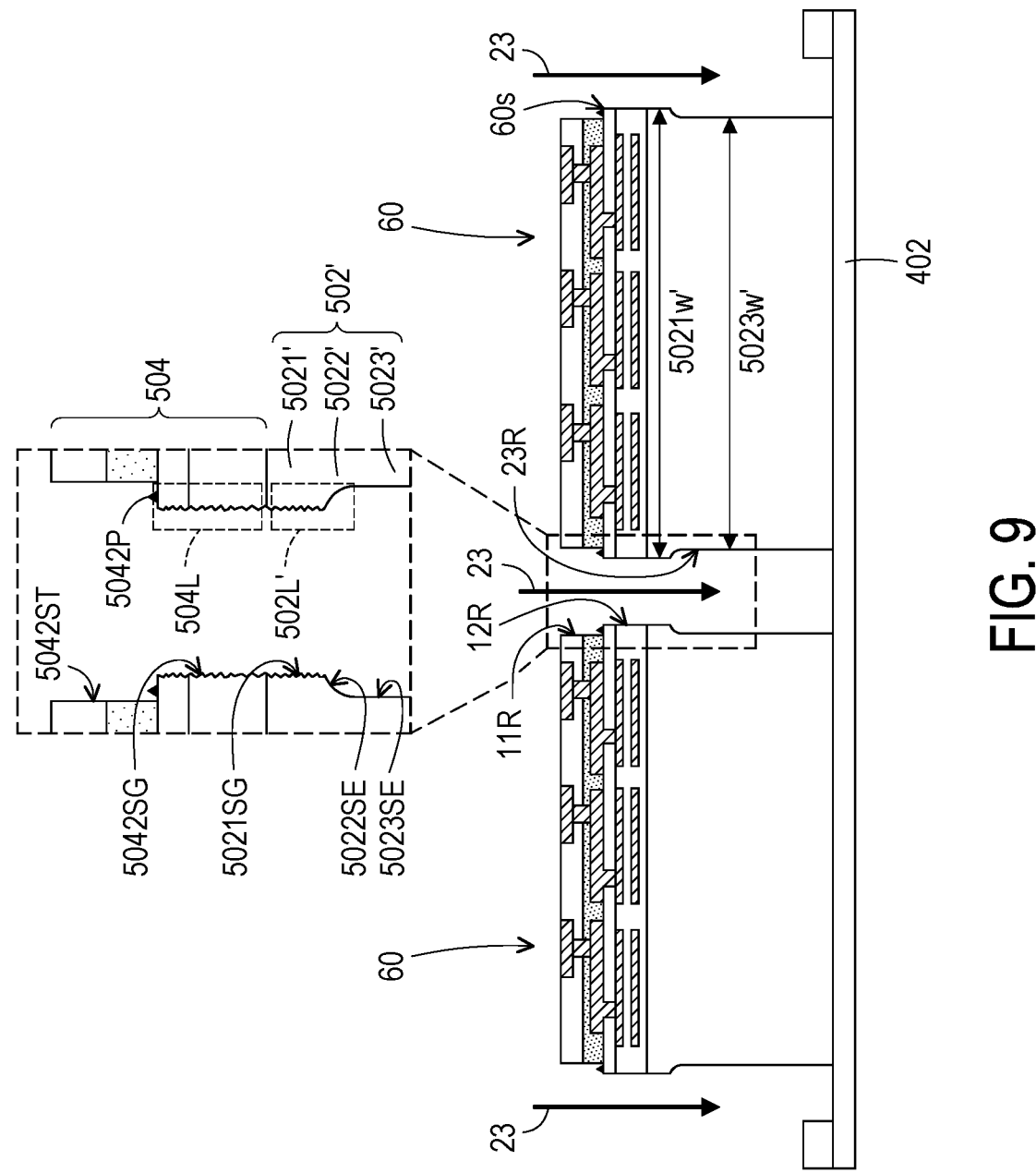
FIGS. 9 and 10 illustrate schematic views of intermediate steps during a process for forming a semiconductor device, in accordance with some embodiments.
Figure 10:
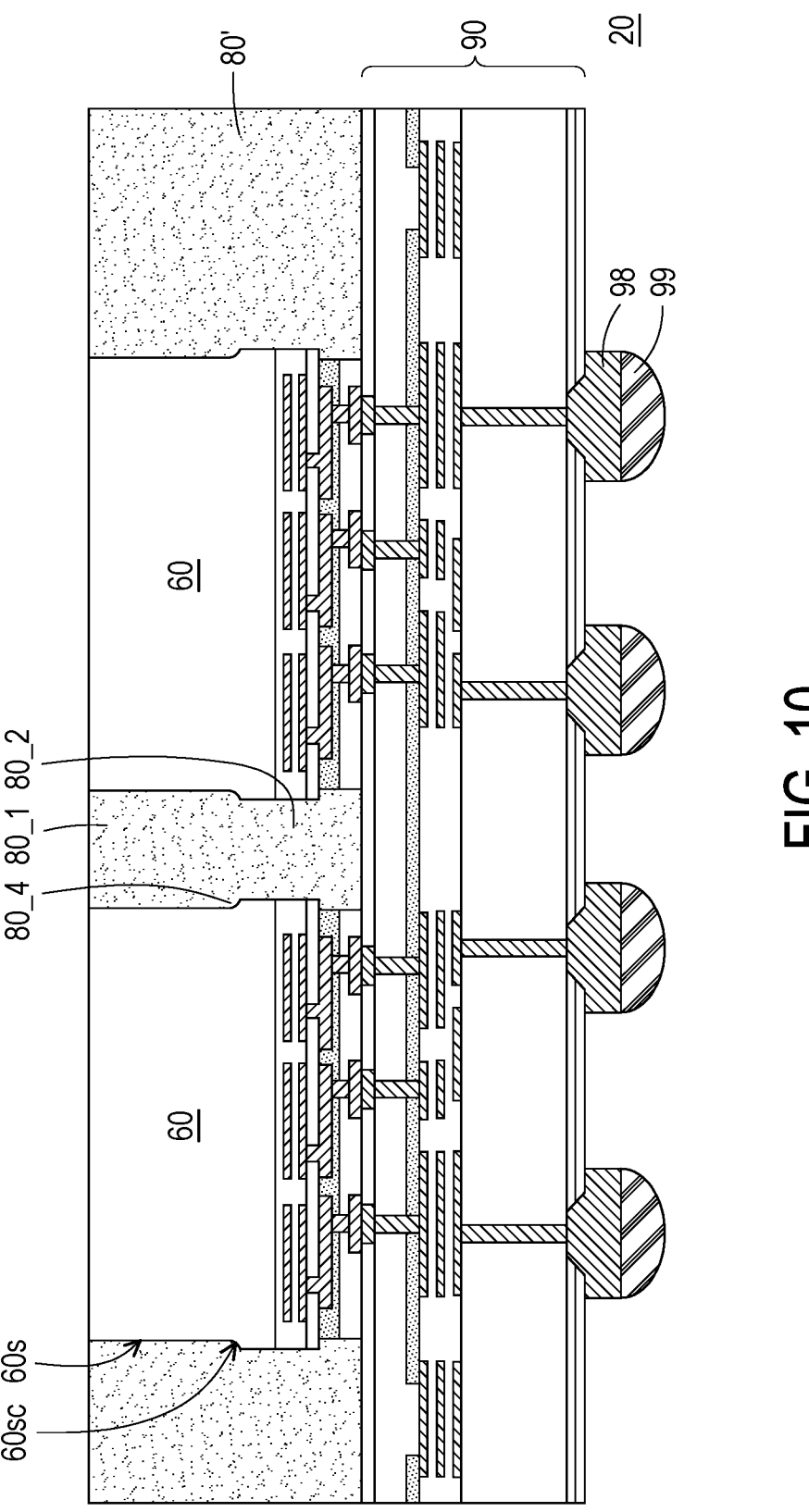

FIGS. 9 and 10 illustrate schematic cross-sectional views of intermediate steps during a process for forming a semiconductor device, in accordance with some embodiments. Unless specified otherwise, like reference numerals in this embodiment represent like components in the embodiment shown in FIGS. 1 through 8 formed by like processes. Accordingly, the processes and applicable materials may not be repeated herein.

Referring to FIG. 9, the semiconductor wafer may be singulated by sequentially forming the first recess 11R, the second recess 12R extending from the first recess 11R, and the third recess 23R extending from the second recess 12R. The formation of the first recess 11R and the second recess 12R may be similar to the processes described in FIGS. 1 through 4, where the first recess 11R is defined by the sidewall 5042ST of the interconnect structure 504 and the second recess 12R is defined by the sidewall 5042SG of the interconnect structure 504 and the sidewall 5021SG of the semiconductor substrate 502'. In some embodiments, after the second recessing process 12 as described in FIG. 4, a third recessing process 23 is performed on the semiconductor wafer, where the rear surface of the semiconductor wafer remains attached to the tape 402 during the third recessing process 23. The third recessing process 23 may include etching through the remaining semiconductor substrate by such as a dry etch process so as to form the third recess 23R, where the third recess 23R is defined by the sidewalls 5022SE and 5023SE of the semiconductor substrate 502'. In some embodiments, the sidewalls 5022SE and 5023SE formed by etching may be smoother than the sidewalls 5042SG and 5021SG formed by laser grooving. After the third recessing process 23, the semiconductor wafer may be separated into individual top IC dies 60, where the respective top IC die 60 may include the semiconductor substrate 502' and the interconnect structure 504 overlying the semiconductor substrate 502'. The singulation method including multiple recessing processes may lead to the top IC dies 60 having the uneven sidewall 60s.

In some embodiments, the semiconductor substrate 502' includes a first portion 5021' underlying the interconnect structure 504 and having the sidewall 5021SG, a second portion 5022' underlying the first portion 5021' and having the sidewall 5022SE, and a third portion 5023' underlying the second portion 5022' and having the sidewall 5023SE. A region of the first portion 5021' and the second portion 5022' protruded from the third portion 5023' may be viewed as a ledge 502L' of the semiconductor substrate 502' underlying the ledge 504L of the interconnect structure 504. The sidewall 5022SE of the second portion 5022' may be curved as a result of the etching process. The sidewall 5023SE connected to the sidewall 5022SE may be substantially straight relative to the sidewall 5022SE. In some embodiments, a width 5021w' of the first portion 5021' is larger than a width 5023w' of the third portion 5023'. In some embodiments, a width of the second portion 5022' may gradually reduce from a side connected to the first portion 5021' to a side connected to the third portion 5023'.

Referring to FIG. 10 and with reference to FIG. 9, the top IC dies 60 may be coupled to the bottom IC die 90, and then an encapsulant 80' may be formed on the bottom IC die 90 to laterally cover the respective top IC die 60. The conductive materials 99 may be then formed on the bottom IC die 90 to be electrically coupled to the top IC dies 60. A singulation process is optionally performed to form individual semiconductor device 20. The processes of coupling the top IC dies 60 to the bottom IC die 90, forming the encapsulant 80', and forming the conductive terminals 99 may be similar to the processes described in FIGS. 6 through 8, and thus the detailed descriptions are not repeated herein.

With continued reference to FIG. 10 and also referring to FIG. 8, the difference between the semiconductor device 20 in FIG. 10 and the semiconductor device 10 in FIG. 8 includes that the uneven sidewall 60s of the respective top IC die 60 has a curved portion 60sc. The portion of the encapsulant 80' between two adjacent top IC dies 60 may further include a fourth portion 80_4 vertically interposed between the first portion 80_1 and the second portion 80_2. The fourth portion 80_4 may extend along the curved sidewalls of the adjacent top IC dies 60 and may have a gradually changed width to be conformal to the curved portion 60sc. The difference in widths results in ledges along the sidewall of the respective top IC die 60. The ledges formed along the sidewall of the respective top IC die 60 may lead to the encapsulant 80' having portions with different widths to act as a jig, and the jig may compress the top IC die 60 from bonding delamination, thereby improving the reliability of the semiconductor device 20.

Figure 11:
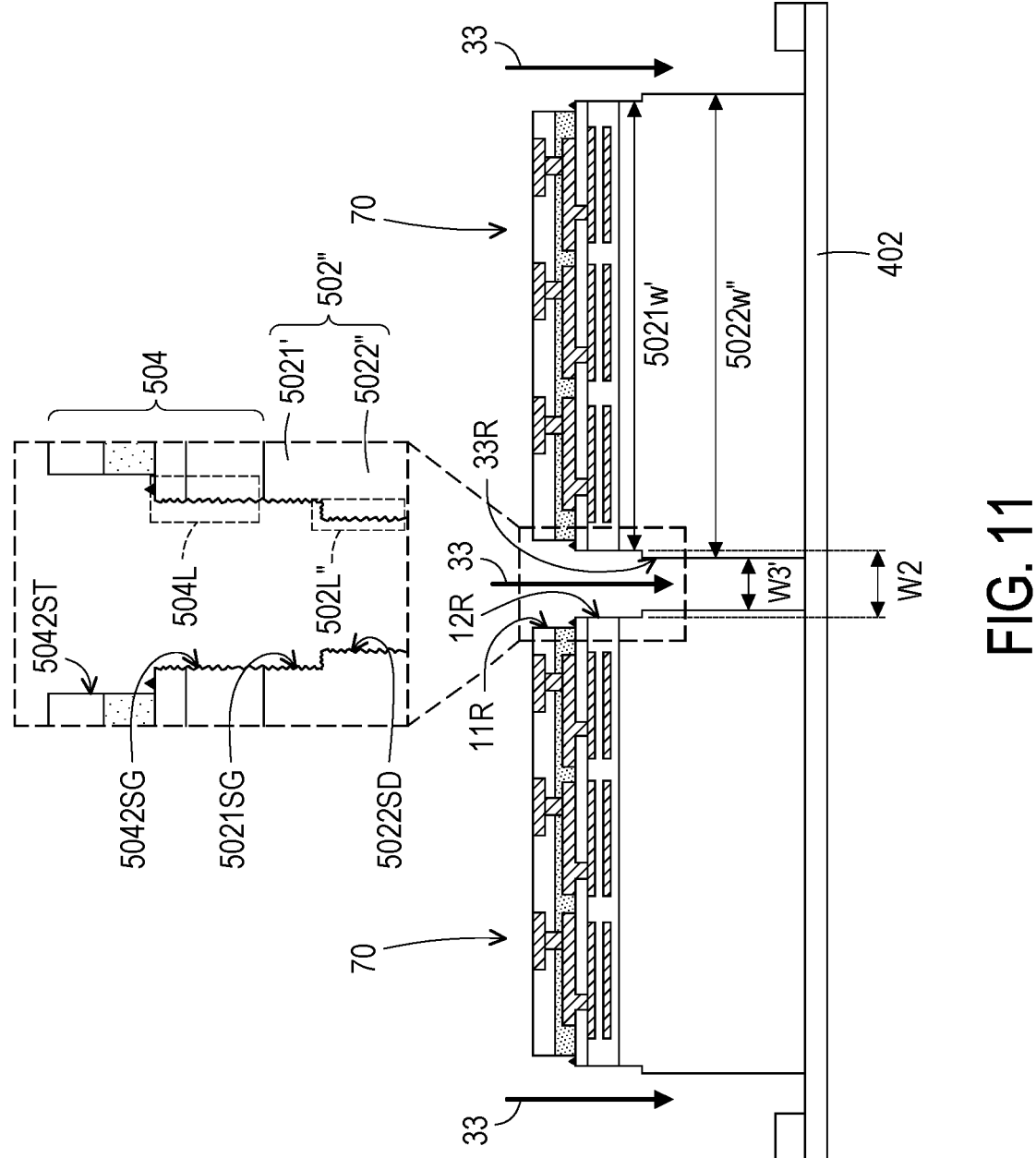
FIGS. 11 and 12 illustrate schematic views of intermediate steps during a process for forming a semiconductor device, in accordance with some embodiments.
Figure 12:
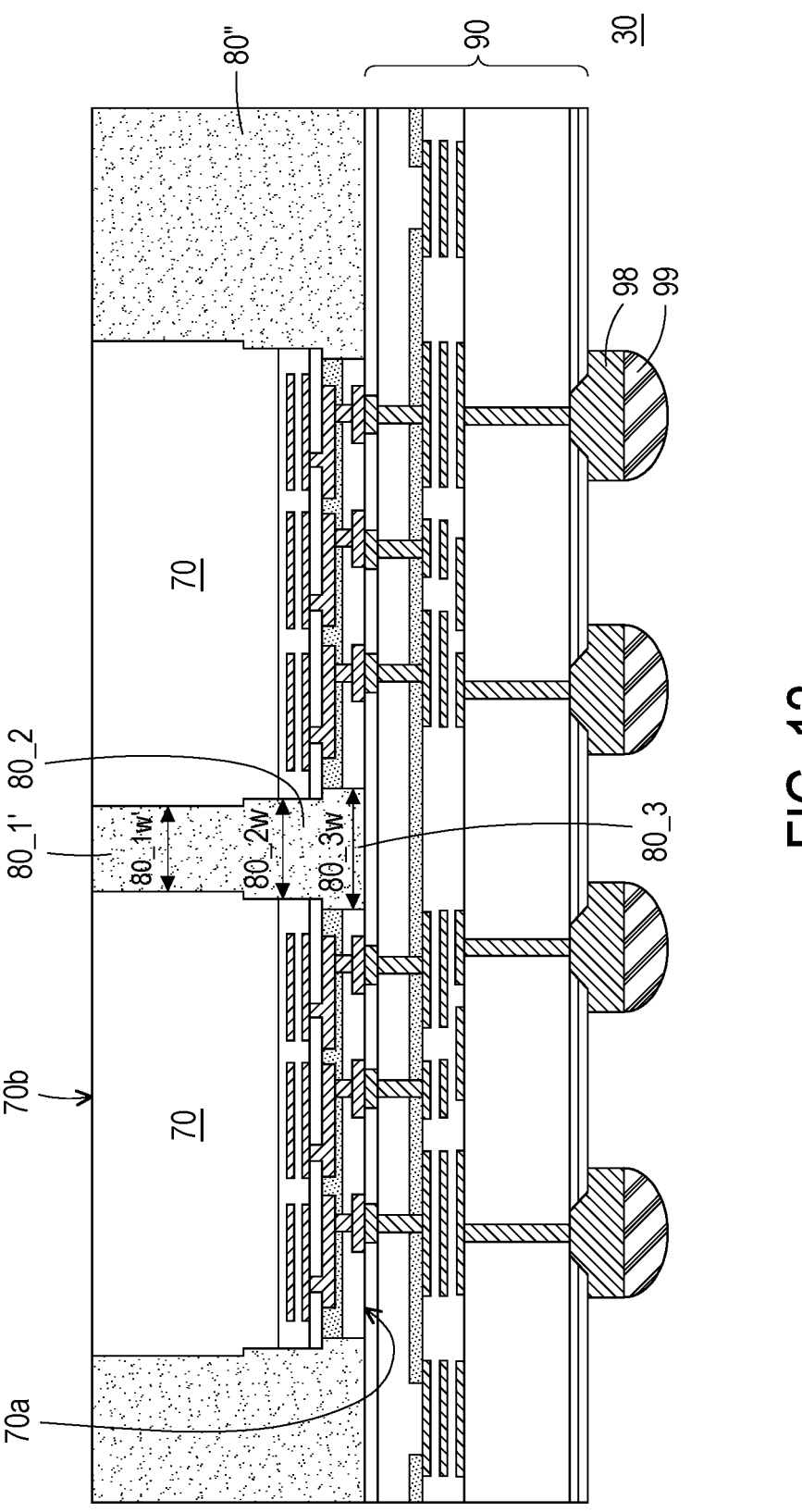

FIGS. 11 and 12 illustrate schematic cross-sectional views of intermediate steps during a process for forming a semiconductor device, in accordance with some embodiments. Unless specified otherwise, like reference numerals in this embodiment represent like components in the embodiment shown in FIGS. 1 through 8 formed by like processes. Accordingly, the processes and applicable materials may not be repeated herein.

Referring to FIG. 11, the semiconductor wafer may be singulated by sequentially forming the first recess 11R, the second recess 12R extending from the first recess 11R, and the third recess 33R extending from the second recess 12R. The formation of the first recess 11R and the second recess 12R may be similar to the processes described in FIGS. 1 through 4, where the first recess 11R is defined by the sidewall 5042ST of the interconnect structure 504 and the second recess 12R is defined by the sidewall 5042SG of the interconnect structure 504 and the sidewall 5021SG of the semiconductor substrate 502". In some embodiments, after the second recessing process 12 as described in FIG. 4, a third recessing process 33 is performed on the semiconductor wafer, where the rear surface of the semiconductor wafer is attached to the tape 402 during the third recessing process 33. The third recessing process 33 may include dicing through the remaining semiconductor substrate by any suitable dicing tool (e.g., a blade, a saw, etc.) to form the third recess 33R, where the third recess 33R is defined by the sidewall 5022SD of the second portion 5022" of the semiconductor substrate 502'. In some embodiments, the sidewall 5042ST formed by etching may be smoother than the sidewall 5022SD formed by dicing/sawing. For example, the lateral dimension of the dicing tool (not shown) is chosen so that the third recess 33R may have a width W3' less than the width W2 of the second recess 12R.

After the third recessing process 33, the semiconductor wafer may be separated into individual top IC dies 70, where the respective top IC die 70 may include the semiconductor substrate 502" and the interconnect structure 504 overlying the semiconductor substrate 502". In some embodiments, the semiconductor substrate 502" includes a second portion 5022" underlying the first portion 5021' and having the sidewall 5022SD. A region of the second portion 5022" protruded from the first portion 5021' may be viewed as a ledge 502L" of the semiconductor substrate 502" that is spatially apart from the ledge 504L of the interconnect structure 504 by the first portion 5021' of the semiconductor substrate 502". In some embodiments, the width 5021w' of the first portion 5021' is less than a width 5022W" of the second portion 5022" of the semiconductor substrate 502".

Referring to FIG. 12 and with reference to FIG. 11, the top IC dies 70 may be coupled to the bottom IC die 90, and then an encapsulant 80" may be formed on the bottom IC die 90 to laterally cover the respective top IC die 70. The conductive materials 99 may be then formed on the bottom IC die 90 to be electrically coupled to the top IC dies 70. A singulation process is optionally performed to form individual semiconductor device 30. The processes of coupling the top IC dies 70 to the bottom IC die 90, forming the encapsulant 80", and forming the conductive terminals 99 may be similar to the processes described in FIGS. 6 through 8, and thus the detailed descriptions are not repeated herein.

With continued reference to FIG. 12 and also referring to FIG. 8, the difference between the semiconductor device 30 in FIG. 12 and the semiconductor device 10 in FIG. 8 includes that the respective top IC die 70 has a stepped sidewall and a portion of the encapsulant 80" between adjacent top IC dies 70 extends along the stepped sidewall. For example, the portion of the encapsulant 80" between adjacent top IC dies 70 has a first portion 80_1' including a width 80_1w' less than the width 80_2w of the underlying second portion 80_2, and the width 80_3w of the third portion 80_3 vertically between the second portion 80_2 and the bottom IC die 90 may be larger than the width 80_2w of the second portion 80_2. The difference in widths between the widths (80_1w' and 80_2w) and the widths (80_2w and 80_3w) is due to the ledges along the sidewall of the respective top IC die 70. It is believed that the encapsulant 80" having different widths may act as a jig to compress the adjacent top IC dies 70 from bonding delamination, thereby improving the reliability of the semiconductor device 30.

Figure 13:
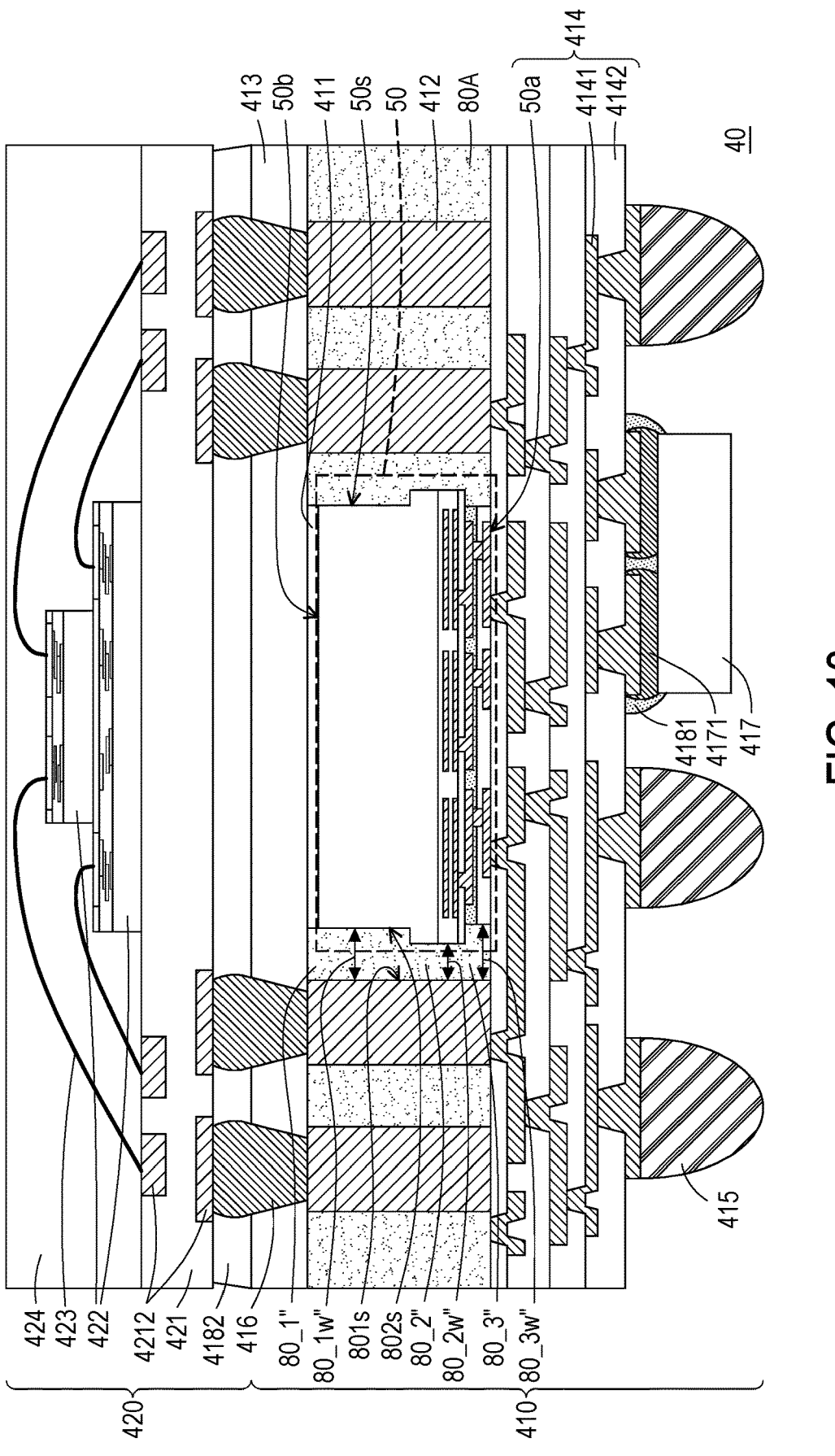
FIG. 13 illustrates a schematic cross-sectional view of a semiconductor package, in accordance with some embodiments.

FIG. 13 illustrates a schematic cross-sectional view of a semiconductor package, in accordance with some embodiments. Unless specified otherwise, like reference numerals in this embodiment represent like components in the previous embodiments. Referring to FIG. 13, a semiconductor package 40 may include a lower package component 410 and an upper package component 420 stacked upon and electrically coupled to the lower package component 410. The lower package component 410 may include at least one top IC die 50 laterally covered by an insulating encapsulant 80A, through insulating vias (TIVs) 412 penetrating through the insulating encapsulant 80A, and a redistribution structure 414 formed continuously below the top IC die 50, the TIVs 412, and the insulating encapsulant 80A.

The top IC die 50 having the uneven sidewall 50s may be the same as the IC die described in FIG. 5 or may be replaced with the IC die described in FIG. 9 or FIG. 11. The insulating encapsulant 80A may be similar to the encapsulant 80 described in FIG. 6 and may include a molding compound or a molding underfill, such as an epoxy, a resin, or the like. The redistribution structure 414 connected to the active surface 50a of the top IC die 50 may include conductive layers 4141 and dielectric layers 4142 alternately stacked upon one another. The conductive layers 4141 reroutes the electrical signal of the top IC die 50 and expands wider than the routing area of the top IC die 50, and the redistribution structure 150 may be referred to as a front-side fan-out redistribution structure.

With continued reference to FIG. 13, the TIVs 412 may be arranged in an array to surround the top IC die 50, and a portion of the insulating encapsulant 80A is interposed between the top IC die 50 and the nearest TIV 412. A sidewall 801s of the portion of the insulating encapsulant 80A connected to the TIV 412 may be substantially vertical, and an opposing sidewall 802s of the portion of the insulating encapsulant 80A connected to the uneven sidewall 50s of the top IC die 50 may be uneven (or discontinuous). For example, the portion of the insulating encapsulant 80A includes a first portion 80_1″ having a width 80_1w′″, a second portion 80_2″ underlying the first portion 80_1″ and having a width 80_2w′″, and a third portion 80_3″ underlying the second portion 80_2″ and having a width 80_3w′″. In some embodiments, the width 80_2w′″ of the second portion 80_2″ is less than the width 80_1w and the width 80_3w′″ of the third portion 80_3″ is greater than the width 80_2w′″. In some embodiments where the top IC die 50 is replaced with other top IC die described in FIG. 9 (or FIG. 11), the portion of the insulating encapsulant may vary depending on the profile of the uneven sidewall of the top IC die and may be similar to the encapsulant described in FIG. 10 (or FIG. 12).

In some embodiments, a protection layer 413 is formed over the rear surface 50b of the top IC die 50 and the surfaces of the TIVs 412 and the insulating encapsulant 80A. In some embodiments, a conductive pattern (not shown) is formed in the protection layer to be physically and electrically coupled to the TIVs, and the conductive pattern and the protection layer may be collectively viewed as a backside redistribution structure. A die attaching film (DAF) 411 is optionally disposed between the rear surface 50b of the top IC die 50 and the protection layer 413 and may be laterally covered by the insulating encapsulant 80A. In some embodiments, the lower package component 410 includes first conductive terminals 415 formed on the outermost conductive layer 4141 of the redistribution structure 414. In some embodiments, second conductive terminals 416 are disposed between the lower package component 410 and the upper package component 420, and the second conductive terminals 416 may each extend through the protection layer 413 to be in electrical contact with the TIVs 412. The top IC die 50 may be electrically coupled to the upper package component 420 through the redistribution structure 414, the TIVs 412, and the second conductive terminals 416. The first conductive terminals 415 and/or the second conductive terminals 416 may be BGA connectors, solder balls, metal pillars, C4 bumps, micro bumps, ENEPIG formed bumps, or the like.

In some embodiments, the lower package component 410 includes at least one electrical device 417, such as an integrated passive device (IPD), which is electrically coupled to the outermost conductive layer 4141 of the redistribution structure 414 through conductive joints 4171 (e.g., solder joints). The conductive joints 4171 may include a same material as the first conductive terminals 415 and/or the second conductive terminals 416. A first underfill 4181 may be formed in a gap between the electrical device 417 and the redistribution structure 414. In some embodiments, a second underfill 4182 is formed in a gap between the upper package component 420 and the lower package 410 to surround portions of the second conductive terminals 416 protruded from the protection layer 413.

Still referring to FIG. 13, the upper package component 420 may include a substrate 421 and one or more semiconductor dies 422 (e.g., memory dies) attached to the substrate 421. The substrate 421 may include silicon, gallium arsenide, SOI, or other suitable semiconductor materials. In some embodiments, the substrate 421 is a multiple-layer circuit board or may include BT resin, FR-4, ceramic, glass, plastic, tape, film, or other supporting materials. The substrate 421 may include conductive features 4212 (e.g., conductive lines, conductive pads, and conductive vias, not individually shown) formed in/on the substrate 421. The semiconductor dies 422 may be electrically coupled to the conductive features 4212 by, e.g., bonding wires 423. In some embodiments, the semiconductor dies 422 are electrically coupled to the top IC die 50 through the redistribution structure 414, the TIVs 412, the second conductive terminals 416, the conductive features 4212 in the substrate 421, and the bonding wires 423. A molding layer 424, which may include an epoxy, an organic polymer, a polymer, etc., may be formed over the substrate 421 and encapsulate the semiconductor dies 422.

The lower package component 410 may be referred to as an integrated fan-out (InFO) package. In some embodiments, the upper package component 420 including memory dies is referred to as a memory package. The semiconductor package 40 may be referred to as an InFO package-on-package (POP). It should be understood that the semiconductor package 40 illustrate in FIG. 13 is merely an example; the top IC dies described herein may also be adapted to apply to other package configurations, such as a system-on-chip (SoC) package, a chip-on-wafer (CoW) package, a chip-on-wafer-on-substrate (CoWoS) package, or the like.

According to some embodiments, a device includes a first IC die and an encapsulant. The first IC die includes a first semiconductor substrate and a first interconnect structure connected to the first semiconductor substrate. The first semiconductor substrate includes a first ledge, and the first interconnect structure includes a second ledge. The encapsulant extends along the first ledge of the first semiconductor substrate and the second ledge of the first interconnect structure.

According to some alternative embodiments, a device includes an IC die including a sidewall and an encapsulant connected to the sidewall of the IC die. The encapsulant includes a first portion, a second portion underlying the first portion, and a third portion underlying the first portion, where a width of the second portion is different from widths of the first portion and the third portion.

According to some alternative embodiments, a method includes forming a first recess having a first width on a semiconductor wafer; forming a second recess extending from the first recess on the semiconductor wafer, wherein a second width of the second recess is less than the first width of the first recess; forming a third recess connected to the second recess to cut through the semiconductor wafer so as to form an IC die with an uneven sidewall, wherein a third width of the third recess is different from the second width of the second recess; and forming an encapsulant to cover the uneven sidewall of the IC die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a first integrated circuit (IC) die comprising:
    a first semiconductor substrate comprising a first ledge; and
    a first interconnect structure connected to the first semiconductor substrate, the first interconnect structure comprising a second ledge, wherein a dielectric protrusion is disposed on a surface of the second ledge of the first interconnect structure; and an encapsulant extending along the first ledge of the first semiconductor substrate and the second ledge of the first interconnect structure.

2. The device of claim 1, wherein the first ledge of the first semiconductor substrate comprises a first sidewall and a second sidewall laterally offset from the first sidewall, the second ledge of the first interconnect structure comprises a third sidewall and a fourth sidewall laterally offset from the third sidewall, the second sidewall of the first semiconductor substrate is connected to and substantially aligned with the fourth sidewall of the first interconnect structure.

3. The device of claim 2, wherein the first ledge of the first semiconductor substrate further comprises a curved surface connected to the first sidewall and the second sidewall.

4. The device of claim 1, wherein the first ledge of the first semiconductor substrate comprises a first sidewall and a second sidewall laterally offset from the first sidewall, the second ledge of the first interconnect structure comprises a third sidewall and a fourth sidewall laterally offset from the third sidewall, the first sidewall of the first semiconductor substrate is connected to and substantially aligned with the fourth sidewall of the first interconnect structure.

5. The device of claim 4, wherein a surface roughness of the third sidewall of the first interconnect structure is less than that of the fourth sidewall of the first interconnect structure.

6. The device of claim 1, wherein the first ledge of the first semiconductor substrate comprises a sidewall and a curved surface connected to the sidewall, and the curved surface is smoother than the sidewall.

7. The device of claim 1, further comprising:

a second IC die connected to an active surface of the first IC die, wherein the encapsulant is disposed on the second IC die to laterally cover the first IC die, and an interface of the active surface of the first IC die and the second IC die is substantially flat.

8. The device of claim 7, wherein a first conductive feature of the first interconnect structure is bonded to a second conductive feature of the second IC die, and a first bonding dielectric layer of the first interconnect structure laterally covers the first conductive feature and is bonded to a second bonding dielectric layer of the second IC die.

9. The device of claim 1, further comprising:

a second IC die comprising an uneven sidewall and laterally spaced apart from the first IC die through the encapsulant.

10. The device of claim 9, wherein the second IC die comprises:

a second semiconductor substrate comprising a first sidewall and a second sidewall laterally offset from the first sidewall; and a second interconnect structure connected to the second semiconductor substrate, the second interconnect structure comprising a third sidewall and a fourth sidewall laterally offset from the third sidewall.

11. The device of claim 1, further comprising:

a through insulating via penetrating through the encapsulant and laterally spaced apart from the first IC die through a portion of the encapsulant, wherein the portion of the encapsulant comprises an uneven side connected to the first IC die and a substantially straight side connected to the through insulating via.

12. A device, comprising:

an IC die comprising a sidewall, the sidewall of the IC die comprising a first sidewall and a second sidewall laterally protruded from the first sidewall, wherein a surface roughness of the first sidewall is less than a surface roughness of the second sidewall; and an encapsulant connected to the sidewall of the IC die, the encapsulant comprising a first portion, a second portion underlying the first portion and connected to the second sidewall of the sidewall of the IC die, and a third portion underlying the first portion and connected to the first sidewall of the sidewall of the IC die, wherein a width of the second portion is different from widths of the first portion and the third portion.

13. The device of claim 12, wherein the width of the second portion is less than the width of the third portion.

14. The device of claim 13, wherein the width of the second portion is greater than the width of the first portion.

15. The device of claim 12, wherein the IC die further comprises a semiconductor substrate and an interconnect structure, the first sidewall comprises a sidewall of the interconnect structure, and the second sidewall comprises a sidewall of the semiconductor substrate.

16. A method, comprising: forming a first recess having a first width on a semiconductor wafer; forming a second recess extending from the first recess on the semiconductor wafer, wherein a second width of the second recess is less than the first width of the first recess; forming a third recess connected to the second recess to cut through the semiconductor wafer so as to form an IC die with an uneven sidewall, wherein a third width of the third recess is different from the second width of the second recess; and forming an encapsulant to cover the uneven sidewall of the IC die, wherein: forming the first recess comprises removing an upper portion of an interconnect structure of the semiconductor wafer within a scribing lane of the semiconductor wafer; and forming the second recess comprises removing a lower portion of the interconnect structure and an upper portion of a semiconductor substrate of the semiconductor wafer underlying the lower portion of the interconnect structure.

17. The method of claim 16, wherein forming the third recess comprises:

etching a lower portion of the semiconductor substrate from a front side of the semiconductor wafer on which the interconnect structure is formed.

18. The method of claim 16, wherein forming the third recess comprises:

dicing a lower portion of the semiconductor substrate from a front side of the semiconductor wafer on which the interconnect structure is formed, wherein the third width of the third recess is less than the second width of the second recess.

19. The method of claim 16, wherein forming the third recess comprises:

dicing a semiconductor substrate of the semiconductor wafer from a rear surface of the semiconductor wafer, wherein the third width of the third recess is greater than the second width of the second recess.

20. The method of claim 16, wherein forming the second recess further comprises:

forming a dielectric protrusion on a surface of the lower portion of the interconnect structure.

* * * * *